(12) United States Patent
Haba et al.

(10) Patent No.: US 8,680,662 B2
(45) Date of Patent: Mar. 25, 2014

(54) WAFER LEVEL EDGE STACKING

(75) Inventors: Belgacem Haba, Saratoga, CA (US); Ilyas Mohammed, Santa Clara, CA (US); Laura Mirkarimi, Sunol, CA (US); Moshe Kriman, Tel Aviv (IL)

(73) Assignee: Tessera, Inc., San Jose, CA (US)

( * ) Notice: Subject to any disclaimer, the term of this patent is extended or adjusted under 35 U.S.C. 154(b) by 90 days.

(21) Appl. No.: 12/456,349

(22) Filed: Jun. 15, 2009

(65) Prior Publication Data

US 2009/0316378 A1    Dec. 24, 2009

Related U.S. Application Data

(60) Provisional application No. 61/061,953, filed on Jun. 16, 2008.

(51) Int. Cl.
     *H01L 23/02*      (2006.01)

(52) U.S. Cl.
     USPC .......... 257/678; 438/106; 257/E33.056; 257/E23.001; 257/E23.061; 257/E21.499

(58) Field of Classification Search
     USPC ........... 361/808; 257/686, E23.01, E21.001, 257/98, 116, 660, 678, 687, 700, 730, 257/E33.056, E23.001, E23.061, E21.499; 438/25, 26, 51, 55, 64, 106
     See application file for complete search history.

(56) References Cited

U.S. PATENT DOCUMENTS

| | | | |
|---|---|---|---|
| 4,074,342 A | 2/1978 | Honn et al. | |
| 4,500,905 A | 2/1985 | Shibata | |
| 4,765,864 A | 8/1988 | Holland et al. | |
| 4,842,699 A | 6/1989 | Hua et al. | |
| 4,897,708 A | 1/1990 | Clements | |
| 4,954,875 A | 9/1990 | Clements | |
| 5,322,816 A | 6/1994 | Pinter | |
| 5,343,071 A | 8/1994 | Kazior et al. | |
| 5,412,539 A | 5/1995 | Elwell et al. | |
| 5,424,245 A | 6/1995 | Gurtler et al. | |

(Continued)

FOREIGN PATENT DOCUMENTS

| | | |
|---|---|---|
| CN | 1723556 A | 1/2006 |
| CN | 1913149 A | 2/2007 |

(Continued)

OTHER PUBLICATIONS

U.S. Appl. No. 60/962,200.

(Continued)

*Primary Examiner* — Matthew W Such
*Assistant Examiner* — Monica D Harrison
(74) *Attorney, Agent, or Firm* — Lerner, David, Littenberg, Krumholz & Mentlik, LLP

(57) ABSTRACT

A microelectronic assembly can include a first microelectronic device and a second microelectronic device. Each microelectronic device has a die structure including at least one semiconductor die and each of the microelectronic devices has a first surface, a second surface remote from the first surface and at least one edge surface extending at angles other than a right angle away from the first and second surfaces. At least one electrically conductive element extends along the first surface onto at least one of the edge surfaces and onto the second surface. At least one conductive element of the first microelectronic device can be conductively bonded to the at least one conductive element of the second microelectronic device to provide an electrically conductive path therebetween.

27 Claims, 16 Drawing Sheets

(56) References Cited

U.S. PATENT DOCUMENTS

| | | |
|---|---|---|
| 5,426,072 A | 6/1995 | Finnila |
| 5,466,634 A | 11/1995 | Beilstein, Jr. et al. |
| 5,563,084 A | 10/1996 | Ramm et al. |
| 5,571,754 A | 11/1996 | Bertin et al. |
| 5,604,673 A | 2/1997 | Washburn et al. |
| 5,608,264 A | 3/1997 | Gaul |
| 5,614,766 A | 3/1997 | Takasu et al. |
| 5,618,752 A | 4/1997 | Gaul |
| 5,646,067 A | 7/1997 | Gaul |
| 5,656,553 A | 8/1997 | Leas et al. |
| 5,661,087 A | 8/1997 | Pedersen et al. |
| 5,682,062 A | 10/1997 | Gaul |
| 5,716,759 A | 2/1998 | Badehi |
| 5,766,984 A | 6/1998 | Ramm et al. |
| 5,767,001 A | 6/1998 | Bertagnolli et al. |
| 5,804,004 A | 9/1998 | Tuckerman et al. |
| 5,814,889 A | 9/1998 | Gaul |
| 5,817,530 A | 10/1998 | Ball |
| 5,880,010 A | 3/1999 | Davidson |
| 5,915,167 A | 6/1999 | Leedy |
| 5,946,545 A | 8/1999 | Bertin et al. |
| 5,973,386 A | 10/1999 | Horikawa |
| 6,002,167 A | 12/1999 | Hatano et al. |
| 6,022,758 A | 2/2000 | Badehi et al. |
| 6,031,274 A | 2/2000 | Muramatsu et al. |
| 6,040,235 A | 3/2000 | Badehi |
| 6,103,552 A | 8/2000 | Lin |
| 6,130,823 A | 10/2000 | Lauder et al. |
| 6,133,640 A | 10/2000 | Leedy |
| 6,177,707 B1 | 1/2001 | Dekker et al. |
| 6,177,721 B1 | 1/2001 | Suh et al. |
| 6,188,129 B1 | 2/2001 | Paik et al. |
| 6,204,562 B1 | 3/2001 | Ho et al. |
| 6,208,545 B1 | 3/2001 | Leedy |
| 6,228,686 B1 * | 5/2001 | Smith et al. ............... 438/117 |
| 6,252,305 B1 | 6/2001 | Lin et al. |
| 6,261,865 B1 | 7/2001 | Akram |
| 6,277,669 B1 | 8/2001 | Kung et al. |
| 6,340,845 B1 | 1/2002 | Oda |
| 6,344,401 B1 | 2/2002 | Lam |
| 6,396,710 B1 | 5/2002 | Iwami et al. |
| 6,472,247 B1 | 10/2002 | Andoh et al. |
| 6,472,293 B1 | 10/2002 | Suga |
| 6,486,546 B2 | 11/2002 | Moden et al. |
| 6,492,201 B1 | 12/2002 | Haba |
| 6,498,381 B2 | 12/2002 | Halahan et al. |
| 6,498,387 B1 | 12/2002 | Yang |
| 6,548,391 B1 | 4/2003 | Ramm et al. |
| 6,551,857 B2 | 4/2003 | Leedy |
| 6,562,653 B1 | 5/2003 | Ma et al. |
| 6,563,224 B2 | 5/2003 | Leedy |
| 6,582,991 B1 | 6/2003 | Maeda et al. |
| 6,607,938 B2 | 8/2003 | Kwon et al. |
| 6,607,941 B2 | 8/2003 | Prabhu et al. |
| 6,608,377 B2 | 8/2003 | Chang et al. |
| 6,611,052 B2 | 8/2003 | Poo et al. |
| 6,621,155 B1 | 9/2003 | Perino et al. |
| 6,624,505 B2 | 9/2003 | Badehi |
| 6,632,706 B1 | 10/2003 | Leedy |
| 6,646,289 B1 | 11/2003 | Badehi et al. |
| 6,656,827 B1 | 12/2003 | Tsao et al. |
| 6,693,358 B2 | 2/2004 | Yamada et al. |
| 6,717,254 B2 | 4/2004 | Siniaguine |
| 6,727,576 B2 | 4/2004 | Hedler et al. |
| 6,730,997 B2 | 5/2004 | Beyne et al. |
| 6,737,300 B2 | 5/2004 | Ding et al. |
| 6,743,660 B2 | 6/2004 | Lee et al. |
| 6,753,205 B2 | 6/2004 | Halahan |
| 6,753,208 B1 | 6/2004 | MacIntyre |
| 6,777,767 B2 | 8/2004 | Badehi et al. |
| 6,784,023 B2 | 8/2004 | Ball |
| 6,806,559 B2 | 10/2004 | Gann et al. |
| 6,828,175 B2 | 12/2004 | Wood et al. |
| 6,844,241 B2 | 1/2005 | Halahan et al. |
| 6,844,619 B2 | 1/2005 | Tago |
| 6,864,172 B2 | 3/2005 | Noma et al. |
| 6,867,123 B2 | 3/2005 | Katagiri et al. |
| 6,870,249 B2 | 3/2005 | Egawa |
| 6,878,608 B2 | 4/2005 | Brofman et al. |
| 6,897,148 B2 | 5/2005 | Halahan et al. |
| 6,958,285 B2 | 10/2005 | Siniaguine |
| 6,972,480 B2 | 12/2005 | Zilber et al. |
| 6,972,483 B1 | 12/2005 | Song |
| 6,982,475 B1 | 1/2006 | MacIntyre |
| 6,984,545 B2 | 1/2006 | Grigg et al. |
| 6,984,885 B1 | 1/2006 | Harada et al. |
| 7,001,825 B2 | 2/2006 | Halahan et al. |
| 7,005,324 B2 | 2/2006 | Imai |
| 7,034,401 B2 | 4/2006 | Savastiouk et al. |
| 7,049,170 B2 | 5/2006 | Savastiouk et al. |
| 7,060,601 B2 | 6/2006 | Savastiouk et al. |
| 7,087,459 B2 | 8/2006 | Koh |
| 7,115,986 B2 * | 10/2006 | Moon et al. ............... 257/701 |
| 7,138,295 B2 | 11/2006 | Leedy |
| 7,160,753 B2 | 1/2007 | Williams, Jr. |
| 7,186,586 B2 | 3/2007 | Savastiouk et al. |
| 7,192,796 B2 | 3/2007 | Zilber et al. |
| 7,193,239 B2 | 3/2007 | Leedy |
| 7,208,343 B2 | 4/2007 | Song et al. |
| 7,208,345 B2 | 4/2007 | Meyer et al. |
| 7,215,018 B2 | 5/2007 | Vindasius et al. |
| 7,241,641 B2 | 7/2007 | Savastiouk et al. |
| 7,241,675 B2 | 7/2007 | Savastiouk et al. |
| 7,285,865 B2 | 10/2007 | Kwon et al. |
| 7,312,521 B2 | 12/2007 | Noma et al. |
| 7,394,152 B2 | 7/2008 | Yu et al. |
| 7,408,249 B2 | 8/2008 | Badihi |
| 7,474,004 B2 | 1/2009 | Leedy |
| 7,495,316 B2 | 2/2009 | Kirby et al. |
| 7,498,661 B2 | 3/2009 | Matsuo |
| 7,504,732 B2 | 3/2009 | Leedy |
| 7,510,928 B2 | 3/2009 | Savastiouk et al. |
| 7,521,360 B2 | 4/2009 | Halahan et al. |
| 7,622,810 B2 | 11/2009 | Takao |
| 7,662,670 B2 | 2/2010 | Noma et al. |
| 7,662,710 B2 | 2/2010 | Shiv |
| 7,663,213 B2 | 2/2010 | Yu et al. |
| 7,705,466 B2 | 4/2010 | Leedy |
| 7,759,166 B2 | 7/2010 | Haba et al. |
| 7,829,438 B2 | 11/2010 | Haba et al. |
| 7,859,115 B2 | 12/2010 | Kim et al. |
| 7,884,459 B2 | 2/2011 | Yoshida et al. |
| 7,901,989 B2 | 3/2011 | Haba et al. |
| 7,944,015 B2 | 5/2011 | Kitagawa et al. |
| 7,952,195 B2 | 5/2011 | Haba |
| 7,973,416 B2 | 7/2011 | Chauhan |
| 8,022,527 B2 | 9/2011 | Haba et al. |
| 8,043,895 B2 | 10/2011 | Haba et al. |
| 8,076,788 B2 | 12/2011 | Haba et al. |
| 2001/0024839 A1 | 9/2001 | Lin |
| 2001/0048151 A1 | 12/2001 | Chun |
| 2002/0047199 A1 | 4/2002 | Ohuchi et al. |
| 2002/0074637 A1 | 6/2002 | McFarland |
| 2002/0109236 A1 | 8/2002 | Kim et al. |
| 2002/0113303 A1 | 8/2002 | Murayama |
| 2002/0127775 A1 | 9/2002 | Haba et al. |
| 2002/0132465 A1 | 9/2002 | Leedy |
| 2002/0171145 A1 | 11/2002 | Higuchi et al. |
| 2003/0006494 A1 | 1/2003 | Lee et al. |
| 2003/0060034 A1 | 3/2003 | Beyne et al. |
| 2003/0094683 A1 | 5/2003 | Poo et al. |
| 2003/0096454 A1 | 5/2003 | Poo et al. |
| 2003/0173608 A1 | 9/2003 | Leedy |
| 2003/0209772 A1 | 11/2003 | Prabhu |
| 2003/0233704 A1 | 12/2003 | Castellote |
| 2004/0014255 A1 | 1/2004 | Grigg et al. |
| 2004/0016942 A1 | 1/2004 | Miyazawa et al. |
| 2004/0070063 A1 | 4/2004 | Leedy |
| 2004/0082114 A1 | 4/2004 | Horng |
| 2004/0104454 A1 | 6/2004 | Takaoka et al. |
| 2004/0142509 A1 * | 7/2004 | Imai ............... 438/109 |
| 2004/0155326 A1 | 8/2004 | Kanbayashi |
| 2004/0155354 A1 | 8/2004 | Hanaoka et al. |
| 2004/0169278 A1 | 9/2004 | Kinsman |

(56) References Cited

U.S. PATENT DOCUMENTS

| | | |
|---|---|---|
| 2004/0221451 A1 | 11/2004 | Chia et al. |
| 2004/0222508 A1 | 11/2004 | Aoyagi |
| 2004/0245614 A1 | 12/2004 | Jobetto |
| 2004/0251525 A1 | 12/2004 | Zilber et al. |
| 2005/0003649 A1 | 1/2005 | Takao |
| 2005/0012225 A1 | 1/2005 | Choi et al. |
| 2005/0046002 A1 | 3/2005 | Lee et al. |
| 2005/0051883 A1 | 3/2005 | Fukazawa |
| 2005/0056903 A1 | 3/2005 | Yamamoto et al. |
| 2005/0067680 A1 | 3/2005 | Boon et al. |
| 2005/0073035 A1 | 4/2005 | Moxham |
| 2005/0095835 A1 | 5/2005 | Humpston et al. |
| 2005/0104179 A1 | 5/2005 | Zilber et al. |
| 2005/0156330 A1 | 7/2005 | Harris |
| 2005/0260794 A1 | 11/2005 | Lo et al. |
| 2005/0263866 A1 | 12/2005 | Wan |
| 2005/0287783 A1 | 12/2005 | Kirby et al. |
| 2006/0006488 A1 | 1/2006 | Kanbe |
| 2006/0017161 A1 | 1/2006 | Chung et al. |
| 2006/0043556 A1 | 3/2006 | Su et al. |
| 2006/0043598 A1 | 3/2006 | Kirby et al. |
| 2006/0043601 A1 | 3/2006 | Pahl |
| 2006/0046348 A1 | 3/2006 | Kang |
| 2006/0046471 A1 | 3/2006 | Kirby et al. |
| 2006/0055050 A1 | 3/2006 | Numata et al. |
| 2006/0055061 A1 | 3/2006 | Hosokawa et al. |
| 2006/0068580 A1 | 3/2006 | Dotta |
| 2006/0076670 A1 | 4/2006 | Lim et al. |
| 2006/0079019 A1 | 4/2006 | Kim |
| 2006/0094165 A1 | 5/2006 | Hedler et al. |
| 2006/0115932 A1 | 6/2006 | Farnworth et al. |
| 2006/0121645 A1 | 6/2006 | Ball |
| 2006/0138626 A1 | 6/2006 | Liew et al. |
| 2006/0175697 A1 | 8/2006 | Kurosawa et al. |
| 2006/0220234 A1 | 10/2006 | Honer et al. |
| 2006/0220262 A1 | 10/2006 | Meyer et al. |
| 2006/0249829 A1 | 11/2006 | Katagiri et al. |
| 2006/0258044 A1 | 11/2006 | Meyer et al. |
| 2006/0292866 A1 | 12/2006 | Borwick et al. |
| 2007/0007556 A1 | 1/2007 | Shibayama |
| 2007/0035001 A1 | 2/2007 | Kuhmann et al. |
| 2007/0037379 A1 | 2/2007 | Enquist et al. |
| 2007/0045803 A1 | 3/2007 | Ye et al. |
| 2007/0045862 A1 | 3/2007 | Corisis et al. |
| 2007/0052050 A1 | 3/2007 | Dierickx |
| 2007/0102802 A1 | 5/2007 | Kang et al. |
| 2007/0126085 A1 | 6/2007 | Kawano et al. |
| 2007/0132082 A1 | 6/2007 | Tang et al. |
| 2007/0148941 A1 | 6/2007 | Haba et al. |
| 2007/0158807 A1 | 7/2007 | Lu et al. |
| 2007/0181989 A1 | 8/2007 | Corisis et al. |
| 2007/0190747 A1 | 8/2007 | Humpston et al. |
| 2007/0249095 A1 | 10/2007 | Song et al. |
| 2007/0257350 A1 | 11/2007 | Lee et al. |
| 2008/0083976 A1 | 4/2008 | Haba et al. |
| 2008/0083977 A1 | 4/2008 | Haba et al. |
| 2008/0090333 A1 | 4/2008 | Haba et al. |
| 2008/0099900 A1 | 5/2008 | Oganesian et al. |
| 2008/0099907 A1 | 5/2008 | Oganesian et al. |
| 2008/0116544 A1 | 5/2008 | Grinman et al. |
| 2008/0116545 A1 | 5/2008 | Grinman et al. |
| 2008/0122113 A1 | 5/2008 | Corisis et al. |
| 2008/0157327 A1 | 7/2008 | Yang |
| 2008/0166836 A1 | 7/2008 | Jobetto |
| 2008/0246136 A1 | 10/2008 | Haba et al. |
| 2008/0284041 A1 | 11/2008 | Jang et al. |
| 2008/0308921 A1 | 12/2008 | Kim |
| 2008/0315407 A1 | 12/2008 | Andrews, Jr. et al. |
| 2009/0009491 A1 | 1/2009 | Grivna |
| 2009/0032966 A1 | 2/2009 | Lee et al. |
| 2009/0039528 A1 | 2/2009 | Haba et al. |
| 2009/0065907 A1 | 3/2009 | Haba et al. |
| 2009/0067135 A1 | 3/2009 | Hirai |
| 2009/0067210 A1 | 3/2009 | Leedy |
| 2009/0121323 A1 | 5/2009 | Kwon et al. |
| 2009/0160065 A1 | 6/2009 | Haba et al. |
| 2009/0166840 A1 | 7/2009 | Kang et al. |
| 2009/0166846 A1 | 7/2009 | Pratt et al. |
| 2009/0174082 A1 | 7/2009 | Leedy |
| 2009/0175104 A1 | 7/2009 | Leedy |
| 2009/0212381 A1 | 8/2009 | Crisp et al. |
| 2009/0218700 A1 | 9/2009 | Leedy |
| 2009/0219742 A1 | 9/2009 | Leedy |
| 2009/0219743 A1 | 9/2009 | Leedy |
| 2009/0219744 A1 | 9/2009 | Leedy |
| 2009/0219772 A1 | 9/2009 | Leedy |
| 2009/0230501 A1 | 9/2009 | Leedy |
| 2009/0309235 A1 | 12/2009 | Suthiwongsunthorn et al. |
| 2009/0316378 A1 | 12/2009 | Haba et al. |
| 2010/0053407 A1 | 3/2010 | Crisp et al. |
| 2010/0065949 A1 | 3/2010 | Thies et al. |
| 2010/0164086 A1 | 7/2010 | Noma et al. |
| 2010/0200966 A1 | 8/2010 | Karnezos |
| 2010/0219523 A1 | 9/2010 | Chow et al. |
| 2010/0225006 A1 | 9/2010 | Haba et al. |
| 2010/0230795 A1 | 9/2010 | Kriman et al. |
| 2011/0006432 A1 | 1/2011 | Haba et al. |
| 2011/0024890 A1 | 2/2011 | Yang et al. |
| 2011/0039370 A1 | 2/2011 | Gomyo et al. |
| 2011/0198722 A1 | 8/2011 | Suh |
| 2011/0248410 A1 | 10/2011 | Avsian et al. |
| 2012/0025364 A1 | 2/2012 | Hoshino et al. |

FOREIGN PATENT DOCUMENTS

| | | |
|---|---|---|
| DE | 19516487 C1 | 7/1996 |
| DE | 102004039906 | 8/2005 |
| EP | 0926723 A1 | 6/1999 |
| EP | 1041624 | 10/2000 |
| EP | 1482553 A2 | 12/2004 |
| EP | 1519410 A1 | 3/2005 |
| EP | 1619722 A1 | 1/2006 |
| EP | 1653510 A2 | 5/2006 |
| EP | 1686627 A1 | 8/2006 |
| EP | 1 741 668 A2 | 1/2007 |
| EP | 1801866 A2 | 6/2007 |
| FR | 2704690 | 11/1994 |
| FR | 2879347 A1 | 6/2006 |
| JP | 60160645 A | 8/1985 |
| JP | 07-509104 A | 10/1995 |
| JP | 08306724 A | 11/1996 |
| JP | 09045848 A | 2/1997 |
| JP | 2001015683 A | 1/2001 |
| JP | 2001035995 A | 2/2001 |
| JP | 2001156250 A | 6/2001 |
| JP | 2001-217386 A | 8/2001 |
| JP | 2001210782 A | 8/2001 |
| JP | 2002093944 A | 3/2002 |
| JP | 2002217331 A | 8/2002 |
| JP | 2003-037758 A | 2/2003 |
| JP | 2003086762 A | 3/2003 |
| JP | 2003163324 A | 6/2003 |
| JP | 2003208655 A | 7/2003 |
| JP | 2004063569 A | 2/2004 |
| JP | 2004080006 A | 3/2004 |
| JP | 2004119473 A | 4/2004 |
| JP | 2004153130 A | 5/2004 |
| JP | 2004158536 A | 6/2004 |
| JP | 2004342862 A | 12/2004 |
| JP | 2005101067 A | 4/2005 |
| JP | 2005303031 A | 10/2005 |
| JP | 2007523482 A | 8/2007 |
| JP | 2007243207 A | 9/2007 |
| JP | 2007528120 A | 10/2007 |
| JP | 04-158565 B2 | 10/2008 |
| KR | 100201672 B1 | 6/1999 |
| KR | 2006-0020822 A | 3/2006 |
| KR | 20070048952 A | 5/2007 |
| KR | 20090013417 A | 2/2009 |
| KR | 20090047776 A | 5/2009 |
| KR | 20090070420 A | 7/2009 |
| KR | 20090079924 A | 7/2009 |
| KR | 20100057025 A | 5/2010 |
| TW | I289936 | 4/2004 |

(56) References Cited

FOREIGN PATENT DOCUMENTS

| WO | 9425987 A1 | 11/1994 |
|---|---|---|
| WO | 9845130 A1 | 10/1998 |
| WO | 9940624 | 8/1999 |
| WO | 2004/025727 A1 | 3/2004 |
| WO | 2004055891 A1 | 7/2004 |
| WO | 2004114397 | 12/2004 |
| WO | 2005081315 | 9/2005 |
| WO | 2006027981 A1 | 3/2006 |
| WO | 2007066409 | 6/2007 |
| WO | 2007066409 A1 | 6/2007 |
| WO | 2008045422 A2 | 4/2008 |
| WO | 2009017758 A2 | 2/2009 |
| WO | 2009017835 A2 | 2/2009 |
| WO | 2009023462 A1 | 2/2009 |

OTHER PUBLICATIONS

U.S. Appl. No. 60/936,617.
U.S. Appl. No. 60/850,850.
U.S. Appl. No. 11/582,186.
U.S. Appl. No. 60/963,209.
U.S. Appl. No. 60/964,069.
International Search Report, PCT/US2009/003643, dated Aug. 28, 2009.
Korean Office Action for Application No. 10-2011-7024111 dated Nov. 15, 2011.
Chinese Office Action and Search Report for Application 200980122523 dated Aug. 20, 2012.
Japanese Office Action for Application No. 2010-519235 dated Nov. 13, 2012.
Bang, U.S. Appl. No. 60/030,463, filed Sep. 6, 2002.
Communication from PCT/US2010/000777, dated Aug. 5, 2010.
International Search Report and Written Opinion, PCT/US08/09207, dated Jan. 16, 2009.
International Search Report and Written Opinion, PCT/US2008/009353 dated Feb. 10, 2009.
International Search Report and Written Opinion, PCT/US2008/009356, dated Feb. 19, 2009.
International Search Report and Written Opinion, PCT/US2008/010746, date May 27, 2009.
International Search Report and Written Opnion, PCT/US2007/021552 dated May 29, 2008.
International Search Report from PCT/US2010/000777, dated Nov. 19, 2010.
International Search Report, PCT/US07/26095, dated Jul. 7, 2008.
International Search Report, PCT/US2008/002659 dated Oct. 17, 2008.
Japanese Office Action for JP2011-554055 dated Mar. 27, 2012.
Office Action from U.S. Appl. No. 11/704,713 mailed Apr. 10, 2012.
Office Action from U.S. Appl. No. 12/908,227 mailed Apr. 9, 2012.
Partial International Search Report, PCT/US2008/002659.
Response to Office Action from U.S. Appl. No. 11/704,713 mailed Mar. 19, 2012.
Response to Office Action from U.S. Appl. No. 12/908,227 mailed Mar. 20, 2012.
Chinese Office Action for Application No. 200880109094.9 dated Jun. 30, 2011.
Chinese Office Action for Application No. 200880110215.1 dated Apr. 19, 2013.
Japanese Office Action for Application No. 2011-514614 dated Sep. 13, 2013.

* cited by examiner

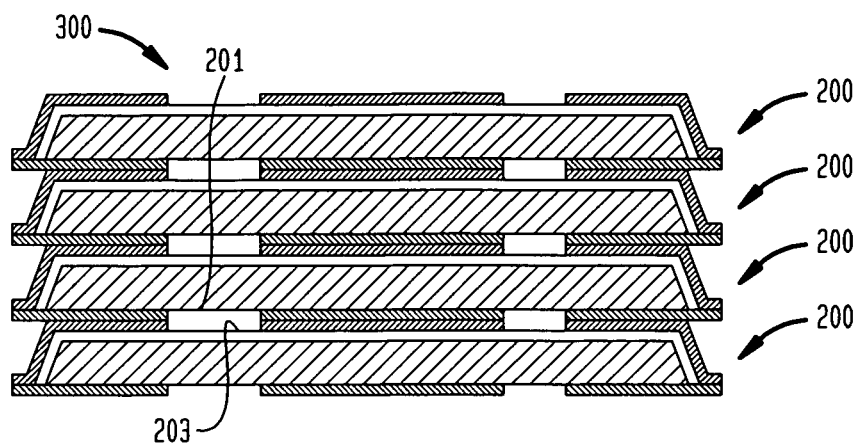
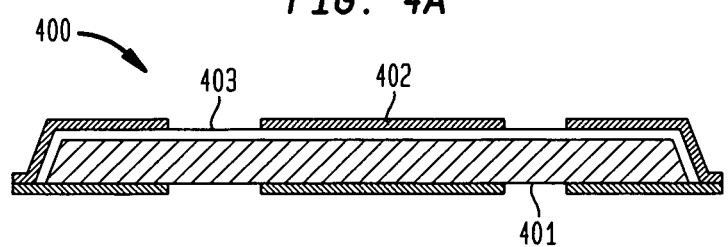
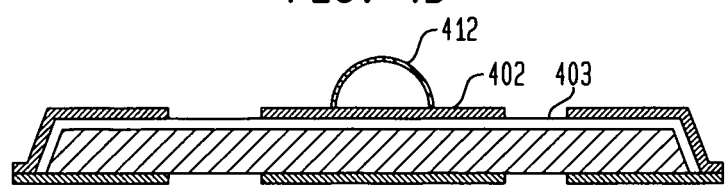

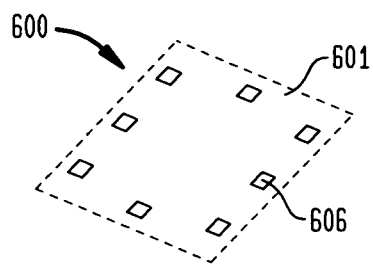
FIG. 6A
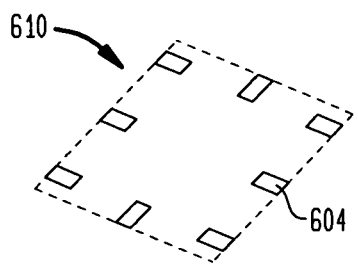
FIG. 6B
FIG. 6C
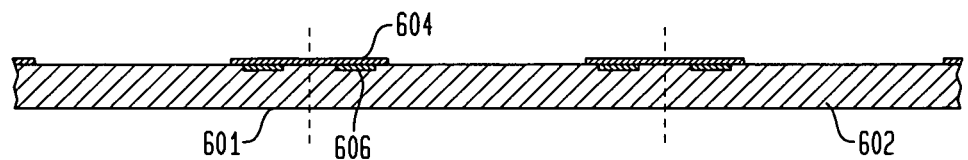
FIG. 6D
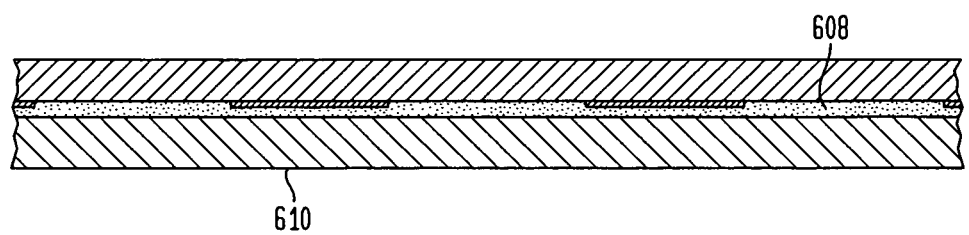

WAFER LEVEL EDGE STACKING

CROSS-REFERENCE TO RELATED APPLICATIONS

This application claims the benefit of the filing date of U.S. Provisional Patent Application No. 61/061,953 filed Jun. 16, 2008, the disclosure of which is hereby incorporated herein by reference.

BACKGROUND OF THE INVENTION

The present invention relates to packaged microelectronic elements and methods of fabricating them, and more particularly, to a stackable packaged microelectronic die assembly.

Microelectronic chips are typically flat bodies with oppositely facing, generally planar front and rear surfaces and with edges extending between these surfaces. Chips generally have contacts, sometimes also referred to as pads or bond pads, on the front surface which are electrically connected to the circuits within the chip. Chips are typically packaged by enclosing them with a suitable material to form microelectronic packages having terminals that are electrically connected to the chip contacts. The package may then be connected to test equipment to determine whether the packaged device conforms to a desired performance standard. Once tested, the package may be connected to a larger circuit, e.g., a circuit in an electronic product such as a computer or a cell phone, by connecting the package terminals to matching lands on a printed circuit board (PCB) by a suitable connection method such as soldering.

Microelectronic packages may be fabricated at the wafer level; that is, the enclosure, terminations and other features that constitute the package, are fabricated while the chips, or die, are still in a wafer form. After the die have been formed, the wafer is subject to a number of additional process steps to form the package structure on the wafer, and the wafer is then diced to free the individually packaged die. Wafer level processing may be a preferred fabrication method because it may provide a cost savings advantage, and because the footprint of each die package may be made identical, or nearly identical, to the size of the die itself, resulting in very efficient utilization of area on the printed circuit board to which the packaged die is attached. A die packaged in this manner is commonly referred to as wafer-level chip scale package or wafer-level chip sized package (WLCSP).

In order to save additional space on the substrate to which a packaged die is mounted, multiple chips may be combined in a single package by vertically stacking them. Each die in the stack must typically provide an electrical connection mechanism to either one or more other die in the stack, or to the substrate on which the stack is mounted, or to both. This allows the vertically stacked multiple die package to occupy a surface area on a substrate that is less than the total surface area of all the chips in the package added together. Because there are in general far more electrical connections when using a die stack than when packaging a single die, the electrical connections between the various dies of the stack must be extremely robust and reliable.

BRIEF SUMMARY OF THE INVENTION

A microelectronic assembly can include a first microelectronic device and a second microelectronic device. Each microelectronic device has a die structure including at least one semiconductor die and each of the microelectronic devices has a first surface, a second surface remote from the first surface and at least one edge surface extending at angles other than a right angle away from the first and second surfaces. At least one electrically conductive element extends along the first surface onto at least one of the edge surfaces and onto the second surface. At least one conductive element of the first microelectronic device can be conductively bonded to the at least one conductive element of the second microelectronic device to provide an electrically conductive path therebetween.

In accordance with one embodiment, the electrically conductive elements of each microelectronic device can include first elements formed by plating onto one of the first and second surfaces and second elements formed by plating onto another one of the first and second surfaces and the at least one edge surface. In one embodiment, the second elements can be plated onto portions of the first elements. For example, the second elements extend along the portions of the first elements on which the second elements are plated.

The second elements can extend along edges of the first elements so as to be conductively joined with the first elements at such edges.

The conductive elements of the first and second microelectronic devices can be bonded using a fusible metal or using conductive paste, for example. In one embodiment, one of the first and second surfaces of the first microelectronic device can confront one of the first and second surfaces of the second microelectronic device and portions of the conductive elements exposed at the confronting surfaces are bonded together. For example, the conductive elements may include conductive pads exposed at at least one of the first or second surfaces of each microelectronic device and the conductive pads can be bonded together.

The conductive elements may include traces and conductive pads, wherein the at least one conductive pad is disposed a spaced distance from the at least one edge surface. In a particular embodiment, a conductive element of each microelectronic device includes a conductive pad which is proximate the at least one edge surface or which can extend to the at least one edge surface.

In a particular embodiment, one or more of the microelectronic devices can include a plurality of dies. In such case, the bond pad-bearing surfaces of at least two of the semiconductor dies included in the at least one microelectronic device may face in the same direction, or they may face in different directions.

The at least one edge surface along which the at least one conductive element extends can be disposed at an angle of between 50 degrees and 89 degrees with respect to at least one of the first and second surfaces.

In the microelectronic assembly, the first and second microelectronic devices can be stacked in a vertical direction and the at least one edge surfaces of the first and second microelectronic devices can be offset from each other.

The first surfaces of the first and second microelectronic devices can extend in lateral directions and have first dimensions in the lateral directions. In one embodiment, the lateral dimensions of the first surfaces of the first and second microelectronic devices can be different.

In one embodiment, a microelectronic assembly is provided which includes first and second microelectronic devices. Each of the microelectronic devices can include a die structure having at least one semiconductor die. Each of the microelectronic devices can have a first surface, a second surface remote from the first surface and at least one edge surface extending away from the first surface. An electrically conductive element can extend along the first surface and onto at least one of the edge surfaces. The at least one conductive element of the first microelectronic device can be conductively bonded to the at least one conductive element of the second microelectronic device to provide an electrically conductive path therebetween.

In one embodiment, the at least one edge surface extends at an angle other than a right angle away from the first and second surfaces. Edge portions of the electrically conductive elements exposed at the at least one edge surfaces can be conductively bonded to provide the electrically conductive path. Such edge portions can be bonded using a fusible metal or can be bonded using conductive paste.

A method of fabricating a stacked microelectronic assembly is provided according to one embodiment. In such embodiment a major surface of a first microelectronic device can be arranged to confront a major surface of a second microelectronic device. An electrically conductive element can be arranged to confront a major surface of a second microelectronic device. An electrically conductive element exposed at the major surface of the first microelectronic device can be conductively bonded with an electrically conductive element exposed at the major surface of the second microelectronic device to provide an electrically conductive path therebetween. Each microelectronic device can include a die structure including at least one semiconductor die and each of the microelectronic devices can have a first major surface, a second major surface remote from the first surface, at least one edge surface and at least one electrically conductive element extending along the first surface onto at least one of the edge surfaces and onto the second major surface.

In accordance with one embodiment, a stacked microelectronic assembly can be fabricated. A stack can be formed which includes a first microelectronic device stacked with a second microelectronic device. Each of the microelectronic devices can include a die structure including at least one semiconductor die. Each of the microelectronic devices can have a first surface, a second surface remote from the first surface and at least one edge surface extending away from the first surface. At least one electrically conductive element can extend along the first surface and onto at least one of the edge surfaces. Portions of the conductive elements exposed at the edge surfaces can be conductively bonded to provide an electrically conductive path therebetween.

In such embodiment, a first microelectronic device can be disposed above the second microelectronic device, and the step of bonding can be performed by heating a fusible metal proximate the conductive element exposed at the at least one edge surface of the first microelectronic device. In such way, the fusible metal may flow onto the conductive element exposed at the at least one edge surface of the second microelectronic device. In such embodiment, the fusible metal may bridge a gap between the conductive elements of the first and second microelectronic devices.

In such embodiment, the first microelectronic device can be disposed above the second microelectronic device and the step of bonding can be performed by dispensing a flowable conductive material onto the conductive element exposed at the at least one edge surface of the first microelectronic device. The conductive material may then flow onto the conductive element exposed at the at least one edge surface of the second microelectronic device.

BRIEF DESCRIPTION OF THE DRAWINGS

The devices and methods described herein are best understood when the following description of several illustrated embodiments is read in connection with the accompanying drawings wherein the same reference numbers are used throughout the drawings to refer to the same or like parts. The drawings are not necessarily to scale; emphasis has instead been placed upon illustrating the principles of the described embodiments.

FIG. 3 shows a cross-section view of several dies forming a die stack structure, in accordance with one embodiment.

FIGS. 4A and 4B show cross-section views of two variants of joining methods to form the device of FIG. 3, in accordance with one embodiment.

FIG. 6A illustrates a perspective view of a single die of the wafer that has a first metallization layer disposed over the bond pads, in accordance with one embodiment.

FIG. 6B shows perspective view of a single die of a wafer with bond pads extended to the edge, in accordance with one embodiment.

FIG. 6C-6I show a cross-section view of a portion of the wafer with dies similar to that of FIG. 6A undergoing additional processing steps, in accordance with one embodiment.

DETAILED DESCRIPTION

As used in this disclosure, a statement that an electrically conductive structure is "exposed at" a surface of a dielectric structure indicates that the electrically conductive structure is available for contact with a theoretical point moving in a direction perpendicular to the surface of the dielectric structure toward the surface of the dielectric structure from outside the dielectric structure. Thus, a terminal or other conductive structure which is exposed at a surface of a dielectric structure may project from such surface; may be flush with such surface; or may be recessed relative to such surface and exposed through a hole or depression in the dielectric.

Figure 1A:
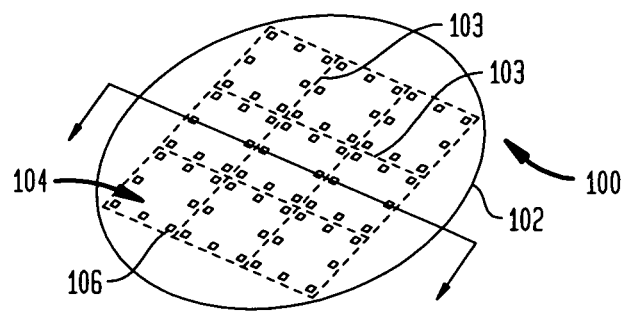
FIG. 1A displays a perspective view of a wafer containing a number of microelectronic chips.
Figure 1B:
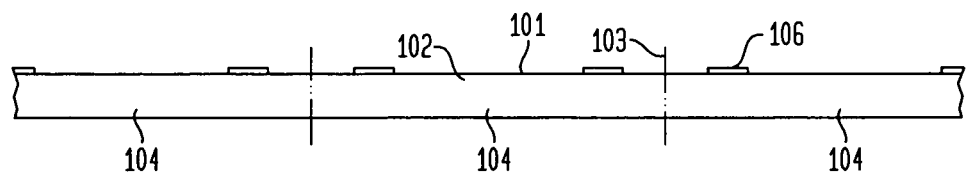
FIG. 1B shows a cross-section of a portion of the wafer.

FIG. 1A displays a perspective view of a wafer 100 containing a number of microelectronic chips. The wafer substrate 102 is commonly a semiconductor material such as silicon but may be made of other materials or be a composite of some type. The wafer is divided up into individual dies 104 that comprise part, or all, of the working portion of a microelectronic chip; after additional processing the dies are separated from one another at the dotted lines 103. Each chip may have one or more functions and is created on or under the surface of the substrate using techniques well known to those with skill in semiconductor processing. These examples are not intended to be limiting-the processed wafer 100 could represent any number of types of devices, including memory, processor, image sensor, or other possibilities. Bond pads 106 are electrically connected to circuitry on or in the substrate. FIG. 1B shows a cross-section of a portion of a wafer, such as wafer 100 illustrated in FIG. 1A. For clarity, the bond pads 106 are exposed at a "front" or contact-bearing surface 101 of the substrate 102. The bond pads 106 may protrude above the surface 101, may be flush with the surface or may be recessed with respect to the surface. Dotted lines 103 indicate the dicing lanes between each die. Although the wafer as described herein may be a semiconductor material with working portions formed therein, in other cases the wafer may be a reconstituted wafer wherein the wafer is created from a number of components placed to form individual dies and held together by an adhesive, for example an epoxy. Alternatively, instead of a wafer 100, the structure may be a plurality of dies which are connected together at edges of the dies shown at dotted lines 103, which structure may be rectangular in form, such as a panel. The edges of the dies may meet at the dotted lines and the semiconductor material may be a continuous uncut structure, or the edges of the dies may be spaced from each other and joined in a reconstituted structure with an adhesive.

FIG. 1C-1I show steps for processing the wafer in accordance with one embodiment. Note that the steps illustrated may be performed in the order described, or, alternatively, in a different order. In some implementations, two or more of the described steps may be combined into a single step. In other implementations, a described step may be excluded completely from the process. In yet other variants, additional processing steps may be required.

Figure 1C:
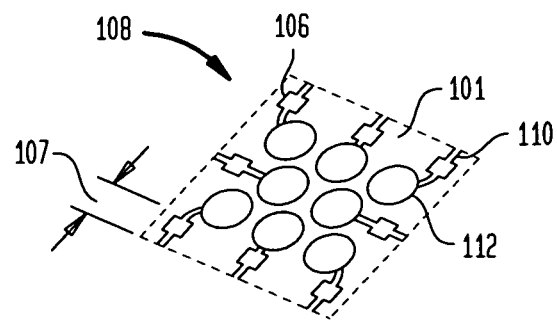
FIG. 1C illustrates a perspective view of a single die of the wafer that has a first metallization layer disposed over the bond pads, in accordance with one embodiment.
Figure 1D:
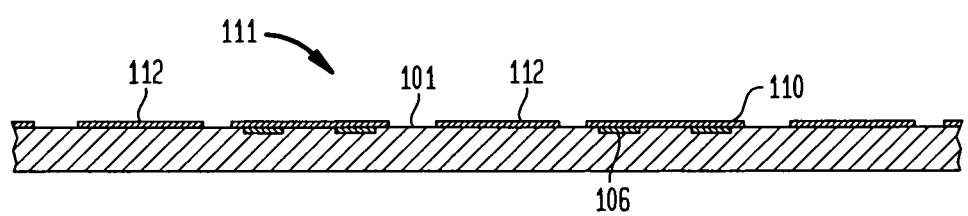
FIGS. 1D-1I show a cross-section of a portion of the wafer similar to that of FIG. 1B undergoing additional processing steps.

FIG. 1C is a perspective view of a single die 108 of the wafer 100 that has a first metallization layer 110 contacting the bond pads. A metal film can be deposited on a surface 101 of the wafer in some manner such as deposition or plating, and then the film can be patterned to form the metallization layer. In a particular embodiment, a seed layer can be formed on the surface, then patterned and subsequently plated to form the metallization layer. Part of the metallization layer is configured to create connection pads 112 that will be used to connect stacked components. The metallization layer may be configured to be a redistribution layer. Additionally, portions of the metallization layer extend as conductive, e.g., metal traces from the bond pads 106 to the edge of the die. FIG. 1D is a cross-section view of a wafer, such as wafer 100 shown in FIG. 1A, but with the metallization layer 110 added. For simplicity, this figure shows only one connection pad area 112 in contact with each set of bond pads 106 on each die. Note that a particular cross-section may include one or more separate connection areas depending on the desired layout.

Figure 1E:
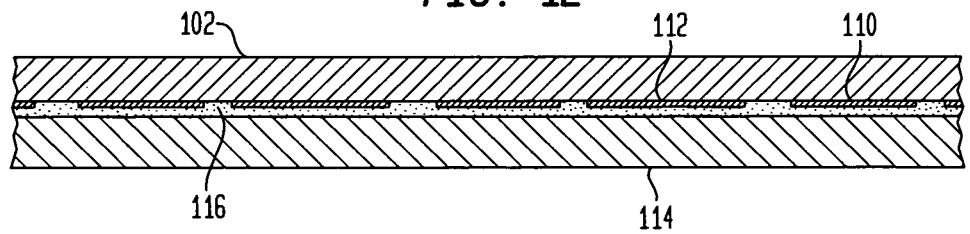
Figure 1F:
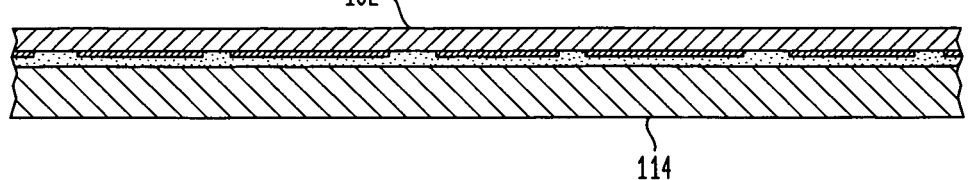

FIG. 1E shows a next step in processing the wafer. In FIG. 1E, the assembly displayed in FIG. 1D is flipped so that the metallization layer 110 is facing down and attached to a separate temporary carrier substrate 114. The temporary substrate 114 is held to the primary substrate 102 using an adhesive layer 116. Thereafter, the primary substrate 102 can be thinned using techniques such as grinding or polishing down to a desired thickness, the result of which is displayed as structure 117 in FIG. 1F.

Figure 1G:
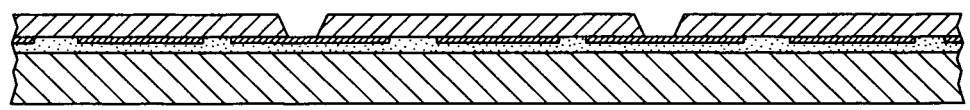
Figure 1H:
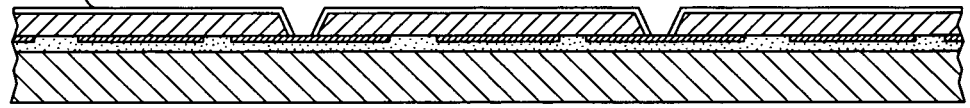

A subsequent step in processing the wafer is shown in FIG. 1G. In FIG. 1G, a channel 118 is cut or etched into the substrate 102 to open up a hole to expose a portion of the first metallization layer 110. In one embodiment, such etch can be performed by a process controlled to stop on an intermediate layer between the semiconductor substrate and the metallization layer, and then proceeding to remove a portion of the intermediate layer to expose the metallization layer 110. The intermediate layer can be a dielectric layer. The channels 118 can be trenches that serve to expose metallization layer portions connected to a plurality of bond pads of one or more dies. FIG. 1H shows the step of forming a dielectric layer 120 on the surface of the substrate 102. The dielectric layer, among other purposes, serves to protect the newly exposed surface of the substrate 102. The dielectric layer insulates the substrate 102 from subsequently formed conductive structure. The bottom of the channels 118 is either left clear by a patterned deposition of the passivation layer, or material left covering the metal traces of the first metallization layer might be exposed in a further step. In either case, the structure of FIG. 1H is formed with a portion of the first metallization layer exposed.

Figure 1I:
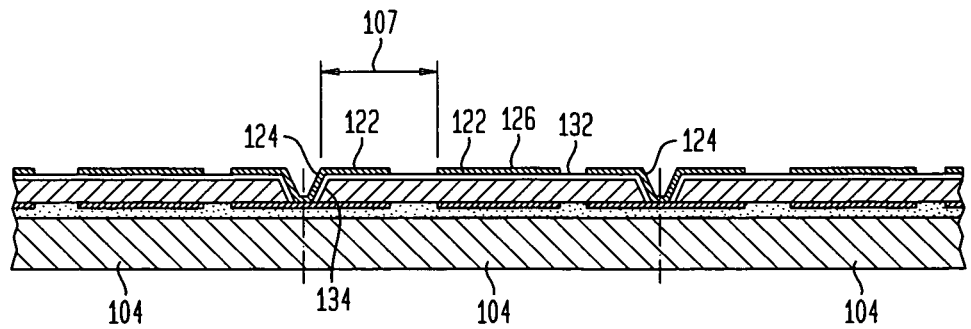

FIG. 1I illustrates the step of forming a second metallization layer 122 to extend along the rear edge surfaces 134 and the rear surface 132 of substrate 102. Again, dotted lines show where the dies 104 may be separated from one another. The second metallization layer 122, like the first metallization layer, can include connection pads 126 and other traces. The connection pads 126 can be a spaced distance 107 from the edge surface of the die 104, as also shown in FIG. 1C. That is, the connection pads themselves do not reach the edge surface. Of particular notice are conducting elements 124 extending along edges of the die structures which electrically connect portions of the first and second metallization layers to one another. In one embodiment, conducting elements 124 are formed as part of the second metallization layer 122 and are formed simultaneously with the connection pads 126 and associated traces of the second metallization layer. Alternatively, the metallization layer 122 and the conducting elements 124 may be formed in separate steps. After forming the conductive elements and metallization layer, the substrate can be severed into a plurality of individual die structures 200 as described below and illustrated relative to FIGS. 2A-2D A process flow summarizing the steps outlined above to create device 200 can be seen in FIG. 2E.

The sizes, shapes and positions of the connection pads of the second metallization layer can be the same as or similar to that of the connection pads of the first metallization layer 110, although other configurations are possible. Alignment of connection pads on the various layers can facilitate later stacking of individual die structures to form a stacked microelectronic assembly such as described below with reference to FIG. 3, for example.

Figure 2A:
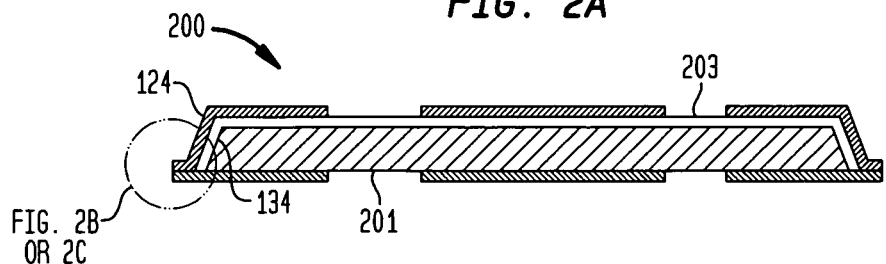
FIG. 2A shows a cross-section view of a separated microelectronic device according to one embodiment.
Figure 2B:
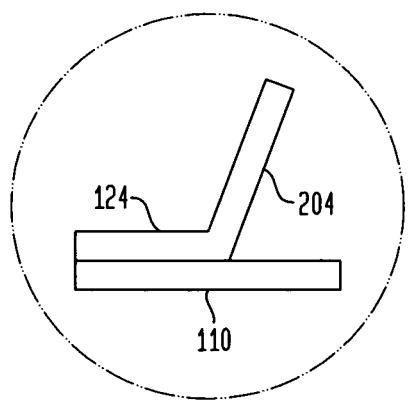
FIGS. 2B and 2C show a detail view of variants of join structures of FIG. 2A, in accordance with one embodiment.
Figure 2C:
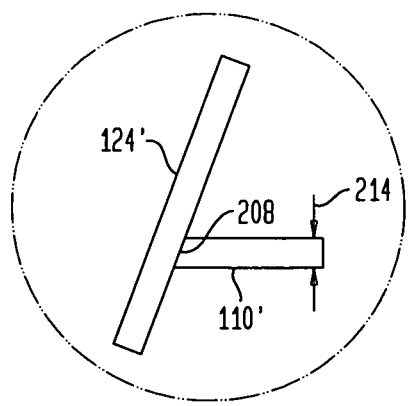
Figure 2D:
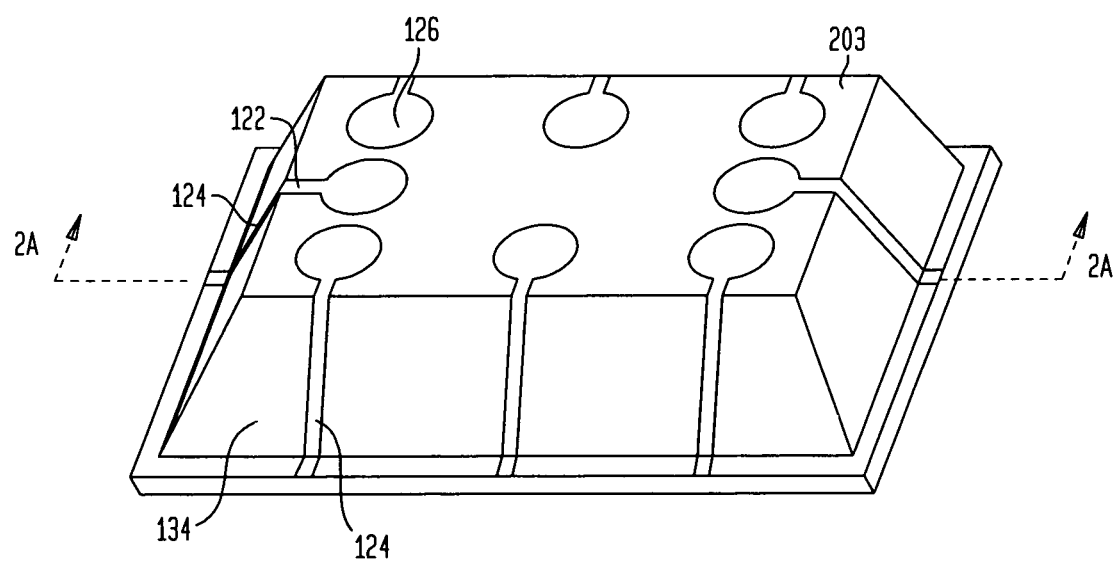
FIG. 2D is a perspective view showing the microelectronic device of FIG. 2A.

FIG. 2A is a sectional viewing showing one embodiment of a final structure of a microelectronic device 200 after it has been separated from neighboring elements. FIG. 2D is a corresponding perspective view looking towards a surface 203 of the device opposite the surface 201 on which the bond pads 106 originally were exposed. FIG. 2B illustrates a detail view of an example connection between a conducting element 124 and the first metallization layer 110. FIG. 2B shows the structure of the joint between the layers if the process has been completed as previously outlined for the embodiment. Processes for forming similar metallization layers and joints between them are described in U.S. Pat. Nos. 6,972,480 and 7,192,796, the disclosures of which are incorporated by reference herein. The conducting element 124 in this example extends in a direction in which the first metallization layer extends horizontally along surface 201. The conducting element may be plated onto the metallization layer. The portion of the conducting element that extends beyond the edge surface 134 can vary in length depending on how the singulation cut is performed or other factors. In a variation, the joint between the conducting element 124' and the metallization layer 110' can be as shown in FIG. 2C in which the conducting element 124' extends along an edge 208 of the metallization layer 110', the edge 208 extending in a direction of a thickness 214 of the layer 110' away from surface 201. Processes for forming similar structure with similar joints between conductive elements are described in U.S. Pat. Nos. 6,646,289 and 6,777,767, the disclosures of which are incorporated by reference herein. Such structure can result if the channels 118 are etched deeper and create a gap entirely through the portion of the first metallization layer that they intersect. In one embodiment, microelectronic devices, like those shown in FIG. 2A, may be stacked and connected to form a stacked die device. One example of this can be seen in FIG. 3. In this example, a die stack assembly 300 is composed of four substantially identical microelectronic devices 200. The various devices 200 in the stack may be taken from a single wafer, or they may come from different wafers. To improve reliability and yield, each die device may be tested before stacking to ensure that it is fully functional before assembly. By using known good devices to make up the stack, the problem of compound yield problems with the die stack can be mitigated. As described, this method of stacking can be perceived as a die-level process where the dies are stacked after being separated from the wafer.

In one embodiment, die stack 300 is functionally complete, but may require additional steps to package it into its final form. Any additional packaging steps involve techniques that are well-known to those with skill in the art.

In an alternative embodiment, the joining may be done at the wafer level. After joining the wafers together into a stack, the completed die stacks could then be separated.

The actual joining of one die to the next layer may be accomplished in a variety of ways. FIGS. 4A and 4B illustrate two exemplary approaches. In FIG. 4A, a microelectronic device 400, like those illustrated in FIG. 2A, is shown. In FIG. 4B a layer of conductive bonding material 412, which can be a fusible metallurgical joining metal, for example, has been placed on the upper connection pad 402. The joining metal, which may be solder, tin, indium, a eutectic or alloy of such metal or other such combination of metals, may be plated on or deposited in a different manner. As shown, the joining metal may be applied only to the connection pads 402 exposed at the rear surface 403, but it is conceivable that the process may place metal on one or more of the exposed metal surfaces including the side conductive elements or other pads at surface of the die. In either case, the dies with joining metal are then aligned and stacked. The stack may then be heated to complete the face-to-face joining. Alternatively, a conductive paste, e.g., silver-filled paste, gold paste, solder paste, etc. can be used as the conductive bonding material to form an electrically conductive path between conductive elements of microelectronic devices in the stack. As illustrated in FIG. 3, the front surfaces 201 of some microelectronic devices confront rear surfaces 203 of other microelectronic devices. Electrically conductive elements at front surfaces 201 of some microelectronic devices 200 are conductively bonded to electrically conductive elements at rear surfaces 203 of the other microelectronic devices 200. In a particular embodiment, two microelectronic devices can be arranged such that their front surfaces 401 (FIG. 4A) confront each other. Then, connection pads exposed at a front surface 401 of a microelectronic device 400 can be joined with connection pads exposed at a front surface 401 of another microelectronic device. In another embodiment, the rear faces of two microelectronic devices can confront each other and the connection pads on such rear faces be joined by the above-described methods. In a particular embodiment, the bonding of conductive elements can be made at the surfaces confronting each other while the microelectronic devices 200 remain attached in wafer form, as shown in FIG. 1I, for example.

Figure 5A:
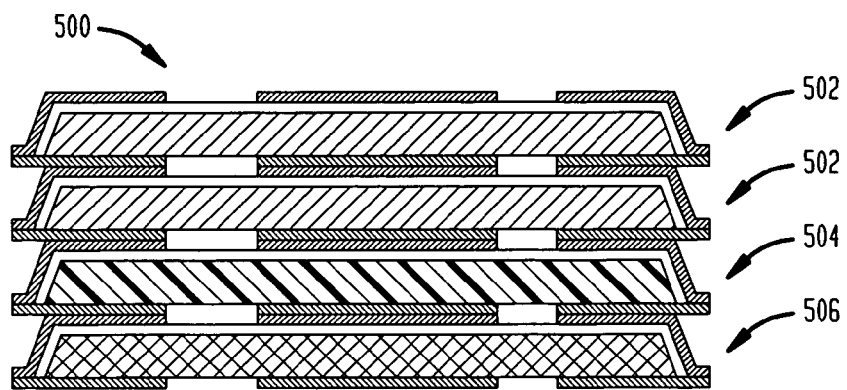
FIG. 5A shows a cross-section view of a die stack structure comprising heterogeneous elements, in accordance with one embodiment.
Figure 5B:
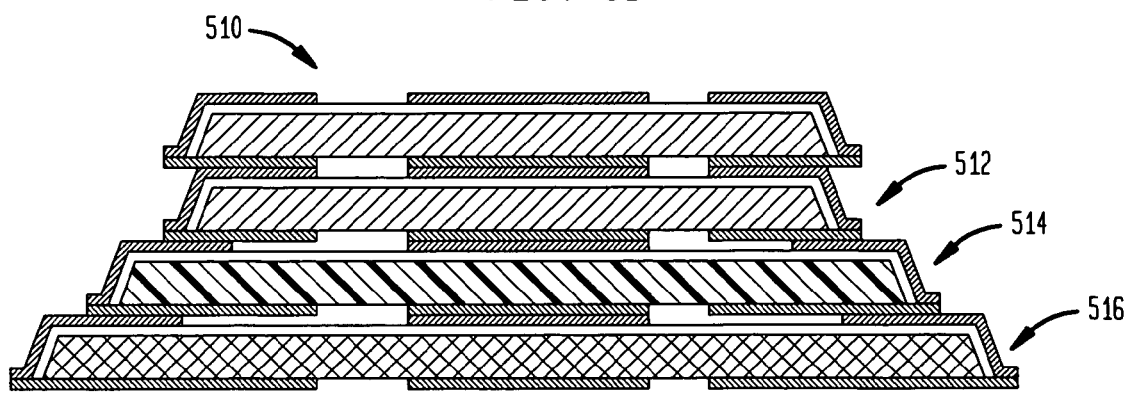
FIG. 5B shows a cross-section view of a die stack structure comprising heterogeneous elements with dies of various sizes, in accordance with one embodiment.

In another die stack embodiment, the die stack may be composed of a heterogeneous assortment of dies with different functionalities. FIG. 5A shows one such die stack structure 500. The die stack structure 500 is similar to that of FIG. 3; however, the individual devices in the stack are different. In this example, the top two dies 502 in the stack are the same, but the bottom two dies (504 and 506) are different. For example, die 502 may be a memory element, die 504 may be a memory controller, and die 506 may be a processing unit. In this stack configuration, the lateral size of the individual dies is substantially the same, and the connection pads between the various dies overlap is essentially the same position. Although the die stack 500 can be assembled at a die level, in alternative embodiments, it can also be assembled at the wafer level with little waste in wafer area on any given wafer. The constraint in die size is not necessary. In fact, FIG. 5B shows an embodiment in which the die stack structure 510 is composed of dies that are heterogeneous in both function and size. In one embodiment, the only constraint to stacking dies is that adjacent faces should have connection pads in the same locations. In the example shown in FIG. 5B, die 514 has connection pads on both the top and bottom surfaces that do not match with each other, but are configured to match with those on dies 512 and 516 respectively.

In one embodiment, the connection pads of a microelectronic device are positioned at or near the bond pads of a chip. For certain configurations, this may provide enough usable area of metal surface to form a connection with a second microelectronic device in a die stack. FIG. 6A shows a perspective view of a die 600 having bond pads 606 exposed at a front, i.e., contact-bearing surface 601. This view is similar to that of FIG. 1C. The die is part of a wafer with one or more dies that may be equivalent to the wafer of FIG. 1A. The metallization layer can include connection pads 604 that are formed over or in contact with the bond pads of the chip. In many cases, the spacing of the bond pads of the chip may be so close already as to prevent the width of the metallization layer over the bond pads from being substantially wider than the bond pads themselves. In a variation of this embodiment, no metallization layer is provided over the bond pads, which can be seen in FIG. 6B. In FIG. 6B, the bond pads are proximate edges and may extend to the edge of the die area so that a second metallization step can connect each bond pad via a conductive element to the other surface of the chip. In other respects, the subsequent steps of the process are similar as for the structure of FIG. 6A.

Figure 2E:
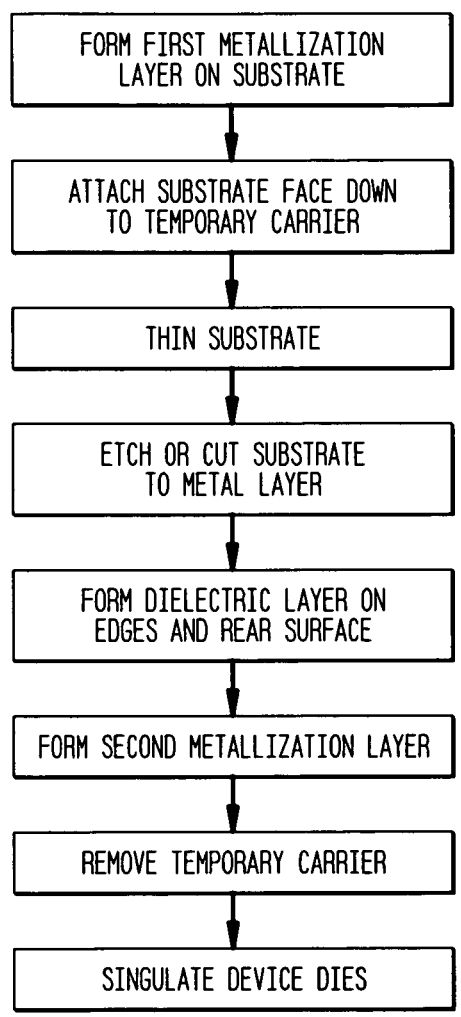
FIG. 2E outlines a process flow used to create a finished microelectronic device according to one embodiment.
Figure 6E:
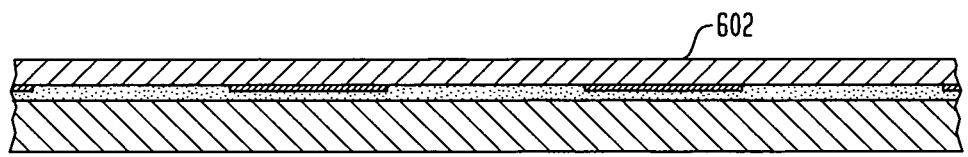
Figure 6F:
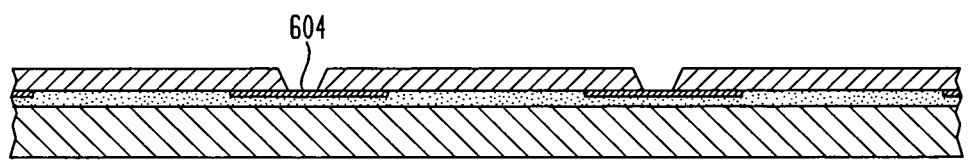
Figure 6G:
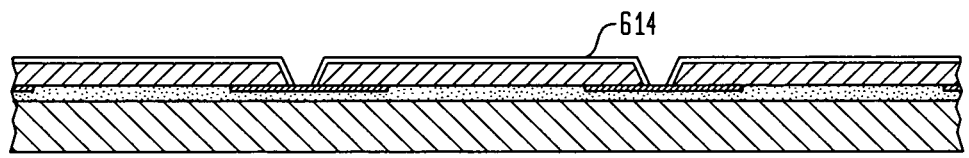
Figure 6H:
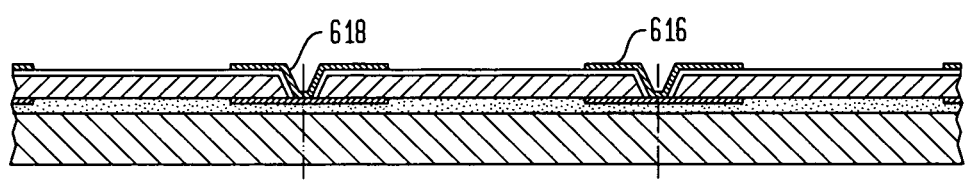
Figure 6I:
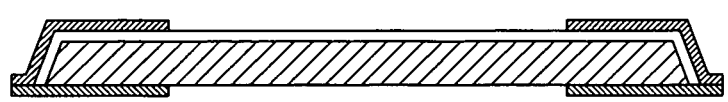

Referring again to FIG. 6A, a substrate 602, e.g., a wafer is processed in a manner similar to the process outlined in FIG. 2E. FIG. 6C shows a cross-section view of an example substrate 602 containing several dies 600 with a metallization layer 604 covering bond pads 606 underneath, although in the case (FIG. 6B) where there is no metallization over the bond pads, the first metallization step may be bypassed. In FIG. 6D, in accordance with one embodiment, the substrate is flipped and bonded to a temporary substrate 610 with an adhesive layer 608. FIG. 6E shows the substrate 602 after the rear face of the die has been thinned. FIG. 6F shows the substrate 602 after it is cut or etched to expose the first metallization layer 604 (or the bond pads in the variant). Then, in accordance with one embodiment, the substrate is covered with a dielectric passivation layer 614 on the thinned and etched substrate, leaving a portion of the first metallization layer exposed, as illustrated in FIG. 6G. In accordance with one embodiment, a second metallization layer is deposited, forming both connection pads 616 and conductive elements 618 connecting the first and second metallization layers. The resulting structure is shown in FIG. 6H. After dicing along the dotted lines, the final structure of the microelectronic device 620 can be seen in FIG. 6I.

Figure 7:
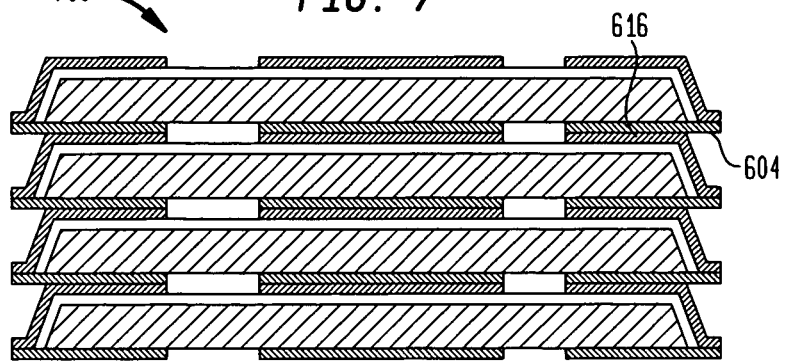
FIG. 7 shows a cross-section view of a die stack structure formed according to one embodiment.

Microelectronic devices 620 can be joined to provide a die stack similarly to previous embodiments. FIG. 7 shows an exemplary die stack assembly 700. Individual devices in the die stack may be joined by methods such as shown in FIGS. 4A and 4B to join connection pads 604 at a front face of one microelectronic device with connection pads 616 exposed at a rear face of the microelectronic device adjacent to such device. Alternatively, the microelectronic devices can be arranged with front faces confronting each other and the pads on the front faces being joined by such methods. In another variation, the microelectronic devices can be arranged so that the rear faces confront each other and the pads thereon be joined. Because the joining area at connection pads of device 620 is typically smaller than one such device 200 (FIG. 2), additional care may be necessary for proper alignment of each device with one another. The die stack 700 is shown here using homogenous elements, but it may also be formed from devices with different size and/or functionality.

Figure 8A:
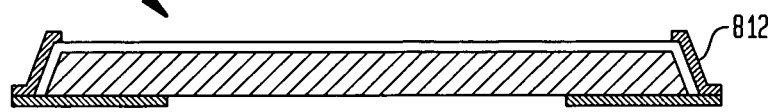
FIG. 8A shows a cross-section view of a die structure according to one embodiment.
Figure 8B:
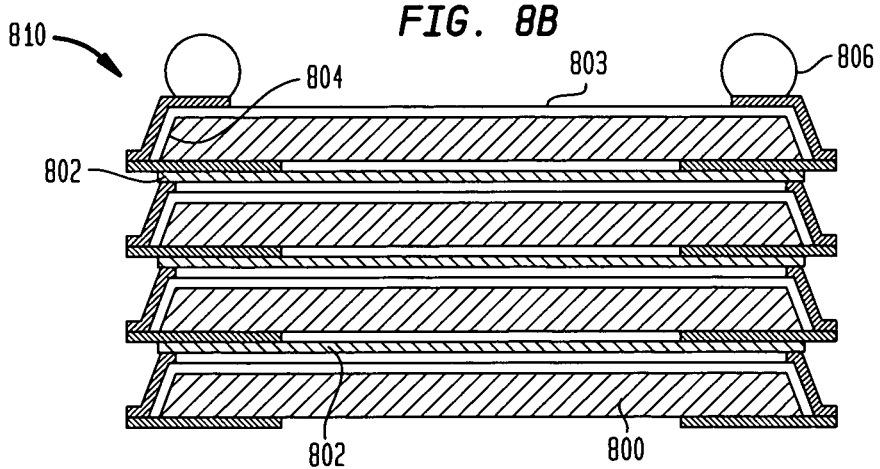
FIG. 8B shows a cross-section view of a die stack with additional reflowable material added, in accordance with one embodiment.
Figure 8C:
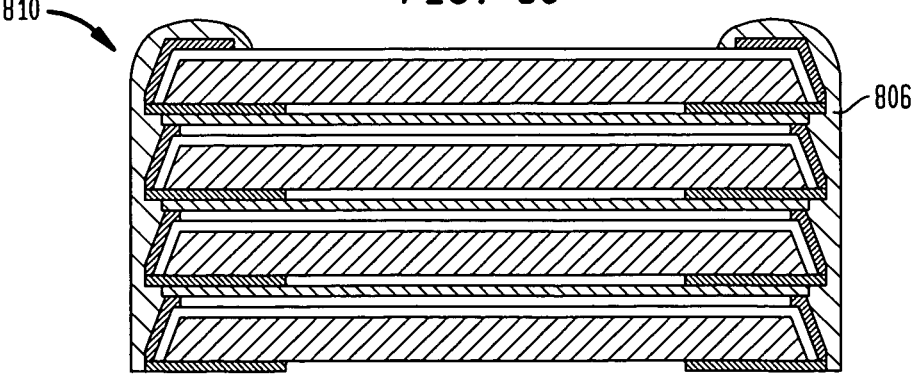
FIG. 8C shows a cross-section view of a die stack structure according to one embodiment.

In yet another embodiment, connections between dies in a stack may be made after the joining step. FIG. 8A shows a single microelectronic device 800. Device 800 is formed similarly to that of the device of FIG. 2 and FIG. 7. Conductive elements 812 exposed at edges 804 are not used to provide a wraparound bridge to the other surface of the die, but instead are connection elements (e.g., bond ribbons, traces or pads) to provide surface area for later conductive bonding. FIG. 8B displays one embodiment of a die stack 810 formed from devices 800. Each device in the stack is attached to the next using an adhesive layer 802. At this point, the devices may not be in electrical contact with each other. To conductively join the devices, a ball of solder or other reflowable material 806 can be deposited on the top of the stack near the side edge. Upon application of heat, the reflowable material 806 flows downward to wet and join together the connection elements exposed at the edge surfaces of the microelectronic devices in the stack. The result may be seen as die stack assembly 810 in FIG. 8B.

Figure 9:
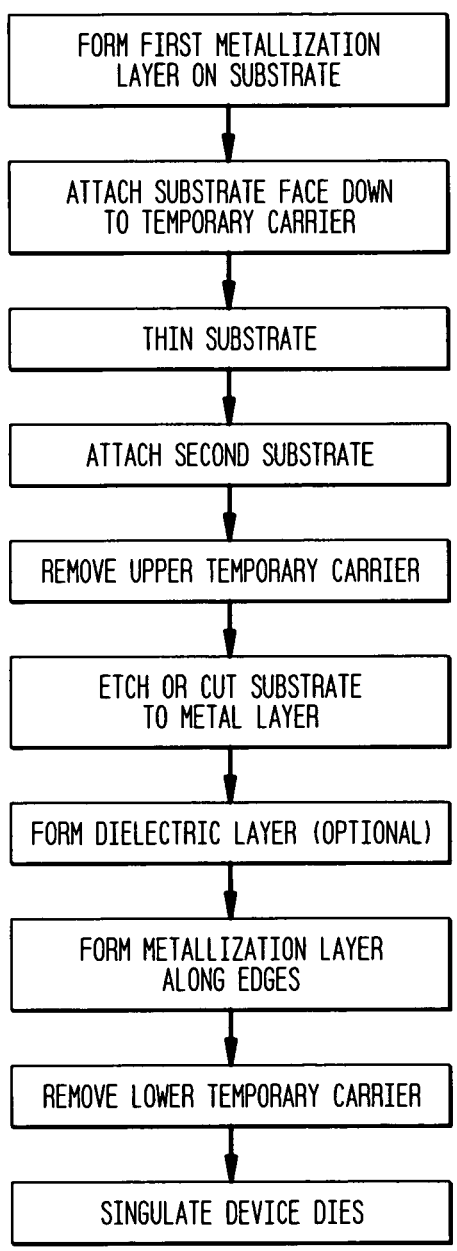
FIG. 9 outlines a process flow used to create a finished device die according to one embodiment.
Figure 10A:
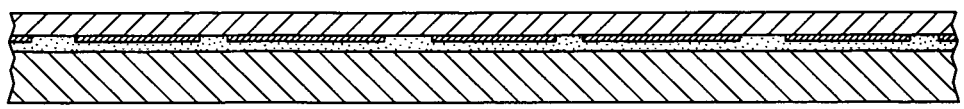
FIG. 10A-10E show a cross-section view of process steps leading to the creation of a die stack comprising two or more dies, in accordance with one embodiment.
Figure 10B:
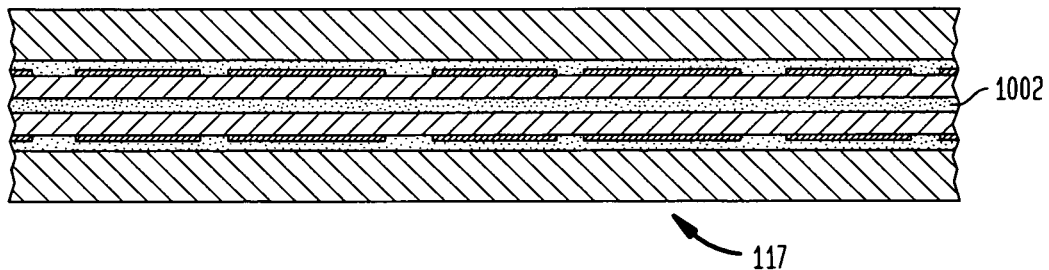
Figure 10C:
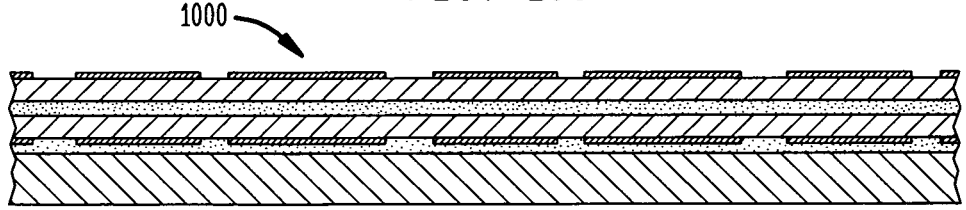
Figure 10D:
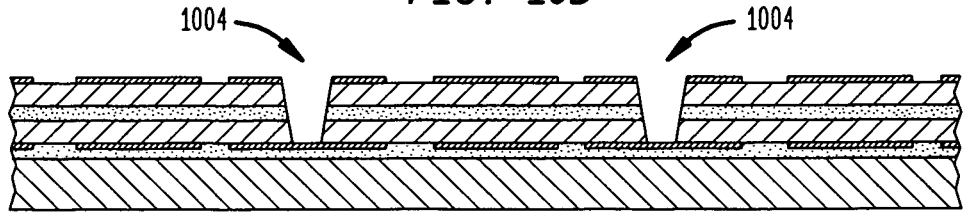

In another embodiment, the above fabrication method (FIGS. 1A-1I) can be applied simultaneously to two or more substrates joined together to form microelectronic devices having internally stacked dies. An example process flow is provided in FIG. 9. In this embodiment, two or more substrates can be joined at rear surfaces before adding side conductive elements. To do so, a substrate is patterned with a first metallization layer and attached to a temporary carrier wafer. The substrate is thinned by grinding, polishing, or some other method. The result of this process is shown in FIG. 10A, which is similar to the structure 117 of FIG. 1F. In FIG. 10B, a second structure 117 is flipped upside-down and attached with an adhesive layer 1002 to the first structure 117. FIG. 10C shows intermediate wafer stack 1000 after the upper temporary carrier wafer and an upper adhesive layer have been removed. Next, as FIG. 10D shows, channels 1004 are cut or etched through both substrates and the central adhesive layer 1002 to expose the first metallization layer of the lower substrate.

Figure 10E:
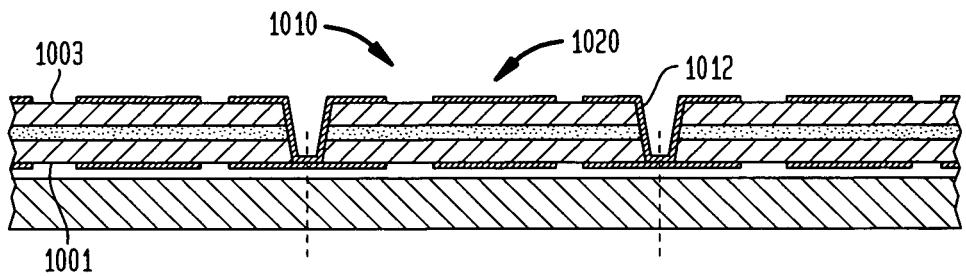
Figure 10F:
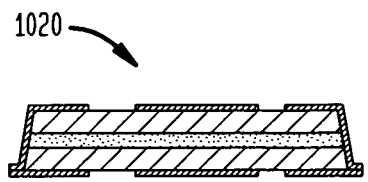
FIG. 10F shows a cross-section view of a die structure comprising two or more dies, in accordance with one embodiment.
Figure 10G:
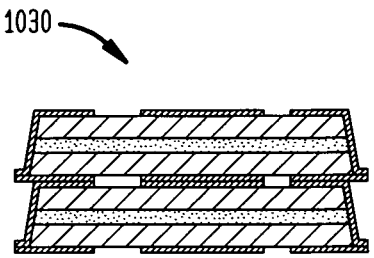
FIG. 10G shows a cross-section view of a die stack structure comprising multiple die structures of FIG. 10F, in accordance with one embodiment.

In this embodiment, a separate passivation step may not be necessary since the thinned surfaces of the substrates are facing inward toward the central adhesive layer. However, this may be added as an optional step after creation of the channels since there may be some unprotected areas of the substrate within the channels depending on how they were created. FIG. 10E shows wafer structure 1010 after a metallization layer is deposited and patterned to form side conductive elements 1012 at edge surfaces which connect conductors, e.g., traces, connection pads on a first surface 1001 of each device 1020 with conductive elements on a second surface 1003 of the device. Note that while the third metallization layer creates the side conductive elements 1012 connecting the top of the stack to the bottom, it also overlaps with the patterned metallization layer of the upper substrate to form electrically conductive paths between the metallization layers. Although there is some overlap of these metal layers, the entire process may be simplified and cost savings achieved with this method since identical structures may be used as part of the process. After separation at the dotted lines, intermediate die stack device 1020 is created and is shown in FIG. 10F. Similarly to previous embodiments, die stack device 1020 may be joined to other similar devices in a composite stack 1030 using methods such as described above with respect to FIGS. 4B, 7 OR 8A-C. Although device 1020 is referred to as an intermediate die stack device, it is contemplated that this device could be packaged and used on its own without subsequent stacking.

Figure 10H:
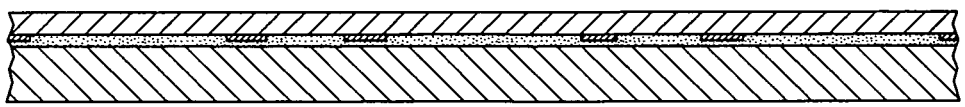
FIG. 10H shows a cross-section view of a variant of a portion of the process flow starting in FIG. 10A, in accordance with one embodiment.

In a variant, the first metallization layer on the upper substrate may be omitted. An example of such is structure 1040 shown in FIG. 10H. In this variant, structure 1040 is joined to the lower substrate with an adhesive layer and then channels 1004 created. Deposition of a metallization layer and subsequent patterning will lead to a structure substantially the same in appearance and function to structure 1010 of FIG. 10E, which may then be processed and stacked further in an equivalent manner. The two wafer substrates in this variant may be created somewhat differently, eliminating one of the required metallization steps in the process.

In a further variant to this embodiment, not pictured here, a second wafer stack 1000 might be flipped and attached to a first wafer stack 1000 with another adhesive layer, and then the upper carrier wafer removed again. This assembly can then be cut and metalized to create a four-level connected stacked device.

Figure 11A:
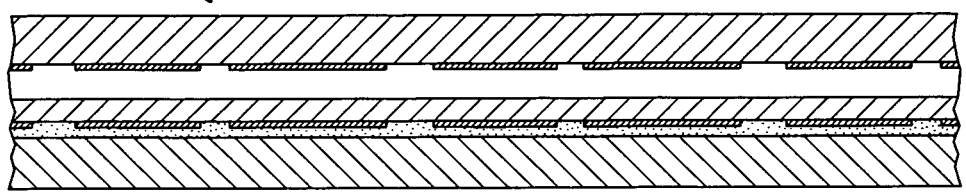
FIG. 11A-11E show a cross-section view of process steps leading to the creation of a die stack, in accordance with one embodiment.
Figure 11B:
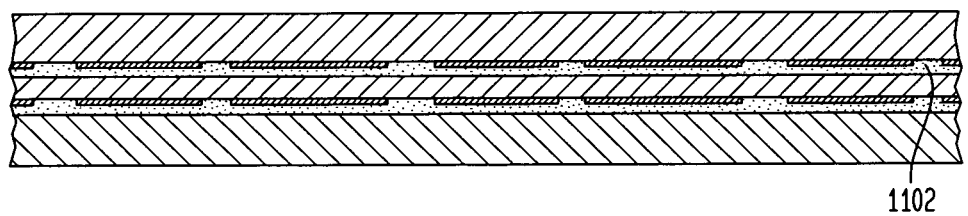
Figure 11C:
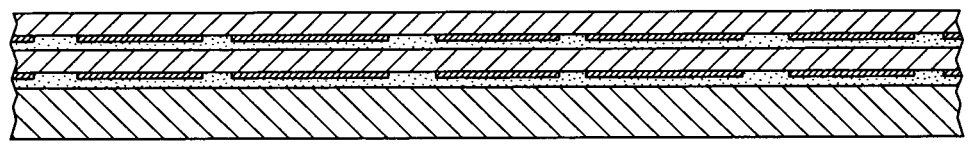
Figure 11D:
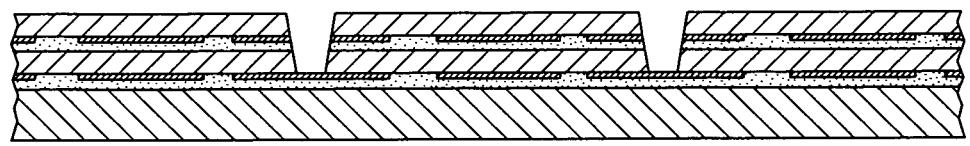
Figure 11E:
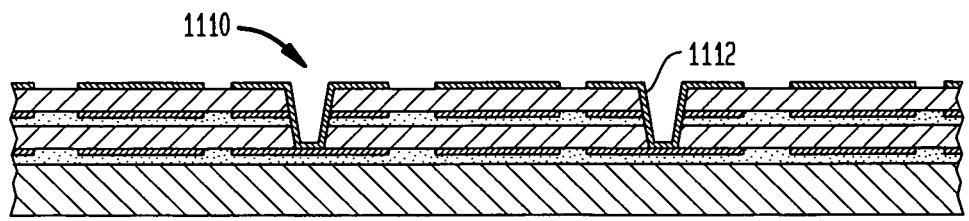
Figure 11F:
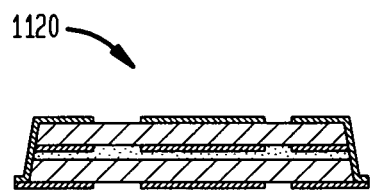
FIG. 11F shows a cross-section view of a die structure comprising two or more dies, in accordance with one embodiment.
Figure 11G:
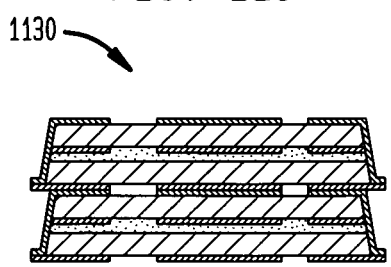
FIG. 11G shows a cross-section view of a die stack structure comprising multiple die structures of FIG. 11F, in accordance with one embodiment.

In yet another embodiment, both of the substrates may be processed in a face-down manner before connecting them electrically. FIG. 11A shows two wafer structures to be joined that are essentially the same as structure 111 of FIG. 1C and structure 117 of FIG. 1F. Rather than attaching structure 111 to a temporary carrier wafer to be thinned (as shown in FIG. 1E), it is instead attached directly to the back face of structure 117. This is illustrated in FIG. 11B, where the two structures are attached with a layer of adhesive 1102. FIG. 11C shows the result of thinning the upper substrate. After this, channels are created through both substrates and the central metallization layer as depicted in FIG. 11D. In FIG. 11E, a third metallization layer is deposited and patterned to create structure 1110. Note here that the edge conductive element portions 1112 of the third metallization layer make contact with both of the other metallization layers. Finally, the lower carrier is removed and the devices 1120 are separated as seen in FIG. 11F. These devices may be stacked in a die stack assembly 1130 as shown in FIG. 11G or in some other manner.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic assembly, comprising:
a first microelectronic device and a second microelectronic device, each of the microelectronic devices including a die structure including at least one semiconductor die, and
each of the microelectronic devices having a first surface, a second surface opposite the first surface, at least one edge surface extending at an angle other than a right angle away from the first and second surfaces, and at least one first electrically conductive element extending along the first surface and onto the at least one of the edge surface and contacting at least one second electrically conductive element, the at least one second electrically conductive element extending along the second surface so as to be opposite the first electrically conductive element along the first surface in a direction of thickness of the assembly, at least one of the first or second conductive elements of the first microelectronic device being conductively bonded to at least one of the first or second conductive elements of the second microelectronic device to provide an electrically conductive path therebetween.

2. A microelectronic assembly as claimed in claim 1, wherein the at least one first electrically conductive element of each of the microelectronic devices includes a first element formed by plating onto the first surface and the at least one edge surface thereof, and the at least one second electrically conductive element of each of the microelectronic devices includes a second element formed by plating onto the second surface thereof, wherein the first element of each of the microelectronic devices is plated onto a portion of the second element thereof.

3. A microelectronic assembly as claimed in claim 2, wherein the first element of each of the microelectronic devices extends along the portion of the second element thereof on which the first element is plated.

4. A microelectronic assembly as claimed in claim 2, wherein the first element of each of the microelectronic devices extends along an edge of the second element thereof.

5. A microelectronic assembly as claimed in claim 1, wherein the at least one conductive element of the first microelectronic device is conductively bonded to the at least one conductive element of the second microelectronic device with a fusible metal.

6. A microelectronic assembly as claimed in claim 1, wherein the at least one conductive element of the first microelectronic device is conductively bonded to the at least one conductive element of the second microelectronic device with conductive paste.

7. A microelectronic assembly as claimed in claim 1, wherein one of the first and second surfaces of the first microelectronic device confronts one of the first and second surfaces of the second microelectronic device and portions of the conductive elements exposed at the confronting surfaces are bonded together.

8. A microelectronic assembly as claimed in claim 7, wherein at least one of the first or second conductive elements of the first and second microelectronic devices includes conductive pads exposed, respectively, at the first or second surfaces of each of the microelectronic devices, the conductive pads being bonded together.

9. A microelectronic assembly as claimed in claim 7, wherein at least one the first or second conductive elements of at least one of the first or second microelectronic devices includes traces and conductive pads, wherein at least one of the conductive pads is disposed a spaced distance from the at least one edge surface of the at least one microelectronic device.

10. A microelectronic assembly as claimed in claim 7, wherein at least one of the conductive elements of each of the microelectronic devices includes a conductive pad proximate the at least one edge surface thereof.

11. A microelectronic assembly as claimed in claim 10, wherein the conductive pad of each of the microelectronic devices extends to the at least one edge surface thereof.

12. A microelectronic assembly as claimed in claim 1, wherein at least one of the die structures includes a plurality of semiconductor dies.

13. A microelectronic assembly as claimed in claim 12, wherein bond pad-bearing surfaces of at least two of the semiconductor dies included in the at least one die structure face in the same direction.

14. A microelectronic assembly as claimed in claim 12, wherein bond pad-bearing surfaces of at least two of the semiconductor dies included in the at least one die structure face in different directions.

15. A microelectronic assembly as claimed in claim 1, wherein the edge surface of at least one of the first or second microelectronic devices extends at an angle of between 50 degrees and 89 degrees with respect to at least one of the first and second surfaces thereof.

16. A microelectronic assembly as claimed in claim 1, wherein the first and second microelectronic devices are stacked in a vertical direction and the at least one edge surfaces of the first and second microelectronic devices are offset from each other in a direction away from the vertical direction.

17. A microelectronic assembly as claimed in claim 1, wherein the first surfaces of the first and second microelectronic devices extend in lateral directions and have first dimensions in the lateral directions, wherein the lateral dimensions of the first surfaces of the first and second microelectronic devices are different.

18. A microelectronic assembly, comprising:
- a first microelectronic device and a second microelectronic device, each of the microelectronic devices including a die structure including at least one semiconductor die, and
- each of the microelectronic devices having a first surface, a second surface opposite the first surface, at least one edge surface extending at an angle other than a right angle away from the first surface, and at least one first electrically conductive element extending along the first surface and onto the at least one edge surface and contacting at least one second electrically conductive element, the at least one second electrically conductive element extending along the second surface so as to be opposite the first electrically conductive element along the first surface in a direction of thickness of the assembly, at least one of the first and second conductive elements of the first microelectronic device being conductively bonded to at least one of the first or second conductive elements of the second microelectronic device to provide an electrically conductive path therebetween.

19. A microelectronic assembly as claimed in claim 18, wherein the at least one edge surface extends at an angle other than a right angle away from the first and second surfaces.

20. A microelectronic assembly as claimed in claim 18, wherein at least edge portions of the electrically conductive elements exposed at the at least one edge surface of the first microelectronic device are conductively bonded to at least edge portions of the electrically conductive elements exposed at the least one edge surface of the second microelectronic device to provide the electrically conductive path.

21. A microelectronic assembly as claimed in claim 20, wherein the at least edge portions of the conductive elements of the first microelectronic device are conductively bonded to the at least edge portions of the conductive elements of the second microelectronic device with a fusible metal.

22. A microelectronic assembly as claimed in claim 20, wherein the at least edge portions of the conductive elements of the first microelectronic device are conductively bonded to the at least edge portions of the conductive elements of the second microelectronic device with conductive paste.

23. A method of fabricating a stacked microelectronic assembly, comprising:
- arranging a major surface of a first microelectronic device to confront a major surface of a second microelectronic device and conductively bonding at least one electrically conductive element exposed at the major surface of the first microelectronic device with at least one electrically conductive element exposed at the major surface of the second microelectronic device to provide an electrically conductive path therebetween, wherein each of the microelectronic devices includes a die structure including at least one semiconductor die, and
- each of the microelectronic devices has a first major surface, a second major surface opposite the first major surface, at least one edge surface extending at an angle other than a right angle away from the first major surface, and at least one first electrically conductive element extending along the first major surface and onto the at least one of the edge surface and contacting the at least one second electrically conductive element at the first major surface, the at least one second electrically conductive element extending along the second major surface so as to be opposite the first electrically conductive element along the first surface in a direction of thickness of the assembly.

24. A method of fabricating a stacked microelectronic assembly, comprising:
- forming a stack including a first microelectronic device with a second microelectronic device, each of the microelectronic devices including a die structure including at least one semiconductor die, and
- each of the microelectronic devices having a first surface, a second surface opposite the first surface, at least one edge surface extending at an angle other than a right angle away from the first surface, at least one first electrically conductive element extending along the first surface and onto the at least one of the edge surface and contacting at least one second electrically conductive element, the at least one second electrically conductive element extending along the second surface so as to be opposite the first electrically conductive element along the first surface in a direction of thickness of the assembly; and
- conductively bonding portions of at least one of the conductive elements exposed at the edge surface of the first microelectronic device to at least one of the conductive elements exposed at the edge surface of the second microelectronic device to provide an electrically conductive path therebetween.

25. A method as claimed in claim 24, wherein the first microelectronic device is disposed above the second microelectronic device, and the step of bonding is performed by heating a fusible metal proximate the conductive element exposed at the at least one edge surface of the first microelectronic device such that the fusible metal flows onto the conductive element exposed at the at least one edge surface of the second microelectronic device.

26. A method as claimed in claim 25, wherein the fusible metal bridges a gap between the conductive elements of the first and second microelectronic devices.

27. A method as claimed in claim 24, wherein the first microelectronic device is disposed above the second microelectronic device, and the step of bonding is performed by dispensing a flowable conductive material onto the conductive element exposed at the at least one edge surface of the first microelectronic device such that the conductive material flows onto the conductive element exposed at the at least one edge surface of the second microelectronic device.

* * * * *